United States Patent [19]

Shoji

[11] Patent Number: 4,668,880
[45] Date of Patent: May 26, 1987

[54] CHAIN LOGIC SCHEME FOR PROGRAMMED LOGIC ARRAY

[75] Inventor: Masakazu Shoji, Warren, N.J.

[73] Assignee: American Telephone and Telegraph Company, AT&T Bell Laboratories, Murray Hill, N.J.

[21] Appl. No.: 593,099

[22] Filed: Mar. 26, 1984

[51] Int. Cl.⁴ .................. H03K 19/096; H03K 19/173; G06F 7/38
[52] U.S. Cl. .................................... 307/469; 307/481; 364/488
[58] Field of Search ............... 307/443, 465, 468, 469, 307/481, 591, 594, 605; 364/716, 488

[56] References Cited

U.S. PATENT DOCUMENTS 4,399,516  8/1983  Blahut et al. ..................... 364/716
4,488,230  12/1984  Harrison ............................ 364/716

FOREIGN PATENT DOCUMENTS 2544434  4/1977  Fed. Rep. of Germany .

OTHER PUBLICATIONS

R. J. Delahanty, "PLA with Internally Ored Functions," *IBM Technical Disclosure Bulletin*, vol. 23, No. 8 (Jan. 1981), pp. 3759-3760.
R. H. Krambeck et al., "High-Speed Compact Circuits With CMOS," *IEEEE Journal of Solid-State Circuits*, vol. SC-17, No. 3, Jun. 1982, pp. 614-619.
M. Shoji, "Electrical Design of BELLMAC-32A Microprocessor," *IEEE International Conference on Circuits and Computers-ICCC 82*, New York, New York, Sep. 28-Oct. 1, 1982, pp. 112-115.
I.B.M. Tech. Disc. Bul., "PLA with Internally ORED Logic.
I.E.E.E. *Journal of Solid-State Circuits*, R. H. Krambeck.

*Primary Examiner*—Stanley D. Miller
*Assistant Examiner*—M. R. Wambach
*Attorney, Agent, or Firm*—David I. Caplan

[57] ABSTRACT

Additional data processing capability can be added to a programmed logic array (PLA), having an AND plane and an OR plane connected serially between an input register and an output register, by inserting a multistage domino CMOS logic network between the OR plane and the output register. The OR plane is an array of single-stage domino CMOS logic and is timed so that it precharges simultaneously with the multistage network. Without prolonging the individual phase durations or adding any registers, the added domino logic network can have a propagation delay time corresponding to more than one phase of the PLA, and hence the network can have correspondingly more stages and more added data processing capability.

9 Claims, 6 Drawing Figures

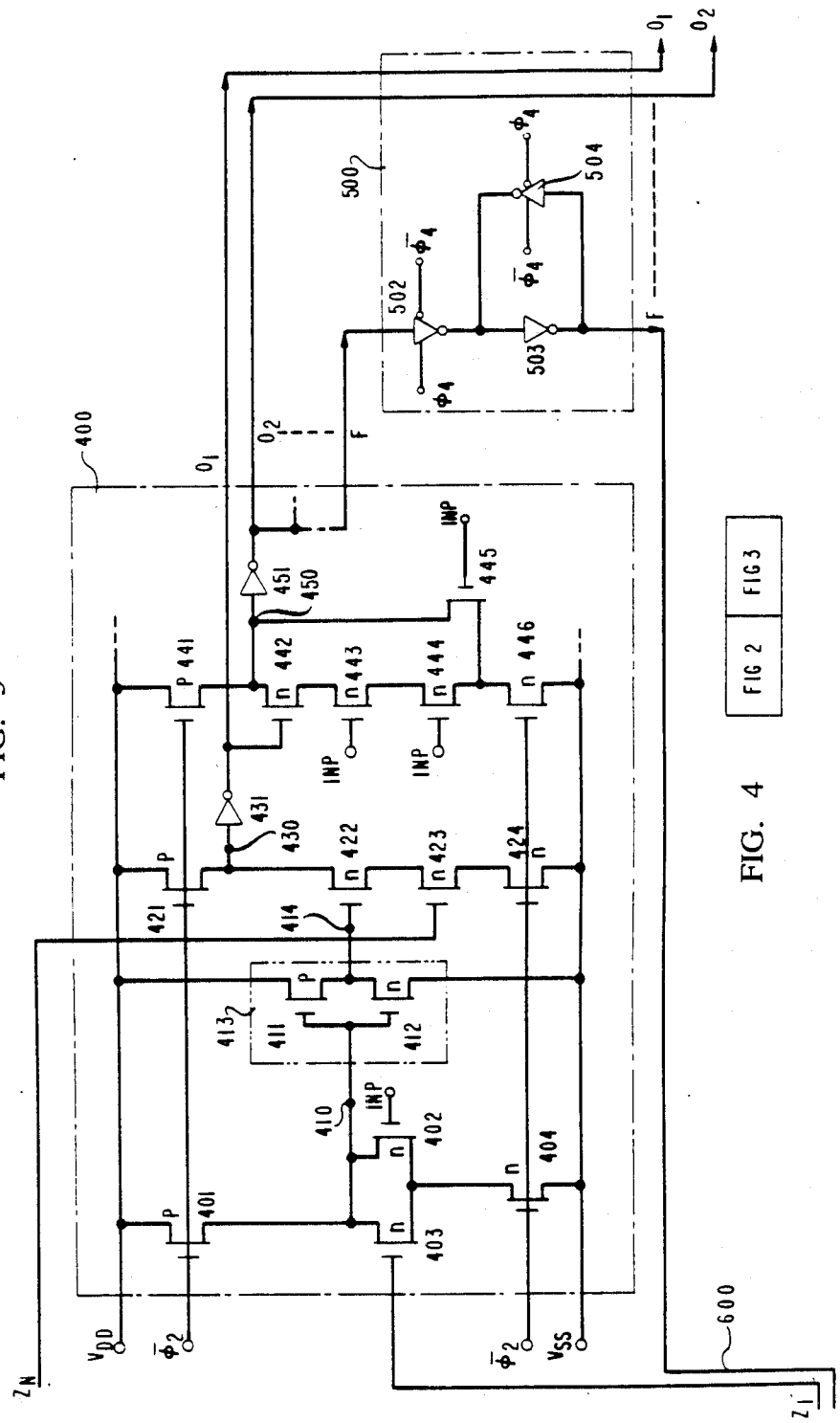

CHAIN LOGIC SCHEME FOR PROGRAMMED LOGIC ARRAY

FIELD OF THE INVENTION

This invention relates to semiconductor logic circuits and more particularly to such circuits which employ programmed logic arrays (PLAs). Still more particularly, this invention relates to logic circuits including two or more PLAs where data signal outputs of a given PLA are processed with data signal outputs of another PLA before being delivered to other parts of the circuit or before being fed back to the given PLA, in order to have a circuit which requires less semiconductor area and which can operate at a higher speed than a circuit comprising only a single (but larger) PLA.

BACKGROUND OF THE INVENTION

Programmed logic arrays (PLAs) are often incorporated in semiconductor integrated circuits used in data processing systems. A PLA performs logic computations or transformations, that is, it processes data by delivering data signal outputs as determined by data signal inputs in accordance with a prescribed logic computation or transformation rule.

A PLA typically has two main portions or planes, known as the AND plane and the OR plane, respectively. Outputs of the AND plane are inputs to the OR plane; and some of the outputs of the OR plane are fed back as inputs to the AND plane, so that the PLA implements a finite state machine. Each plane is in the form of a crosspoint logic array, that is, a rectangular array of intersecting row lines and column lines. Each plane is programmed in that at each crosspoint intersection of a row line with a column line, a separate driver transistor is connected or not, depending upon the desired logic function or transformation of that plane. Each of the input and output data signals of the plane can be a LOW or a HIGH voltage, corresponding to binary digital (1's and 0's) data signals entering into and emanating from the plane.

Basically, each plane of a PLA is designed to perform NOR logic functions of selected inputs thereto in accordance with the desired logic function or transformation of the inputs entering that plane, as described in greater detail below. The specifics of the NOR functions implemented by each of the planes are determined by the configurations in the respective planes of the presences versus absenses of the crosspoint driver transistors at the various crosspoints.

More specifically, in a PLA, inputs to a given plane thereof are applied along parallel (row) input lines (wires) to the gate electrodes of the driver transistors in the logic array corresponding to that plane, and outputs from the plane emanate along parallel (column) output lines orthogonal to the input lines. In one particularly useful form, each logic plane of a PLA is configured as a single stage of pseudo-NMOS logic. That is, each input line is connected to the gate electrode of each of the driver transistors (all n-channel MOS) that are present at crosspoints of that input line; each output line is connected through the source-drain path of a separate p-channel MOS precharge pullup transistor to a first power supply line ($V_{DD}$) and is also connected through the source-drain paths of each of the driver transistors (that are present at crosspoints of that output line) in series through the source-drain path of an n-channel MOS pulldown transistor to a second power supply line ($V_{SS}$). During the precharge phase of a given plane during each PLA cycle of operation, the pullup transistors are turned on while the pulldown transistor is turned off, whereby all the output lines are charged to the voltage ($V_{DD}$) of the first power supply line; and during each evaluation phase immediately succeeding the precharge phase, the pullup transistors are turned off while the pulldown transistor is turned on, whereby each output line does or does not discharge to the voltage ($V_{SS}$) of the second power supply line, depending upon whether or not any of the driver transistors present at crosspoints of that output line is then on.

During each cycle of the PLA operation, in order to supply inputs to the AND plane during appropriate time intervals of each cycle, an input register controls the flow of the inputs into the AND plane; similarly, in order to supply outputs from the OR plane to the rest of the system, as well as feedback to the AND plane during appropriate time intervals, an output register controls the flow of outputs from the OR plane.

The input and output registers, as well as the AND and OR planes, operate in accordance with an orderly control timing sequence. For timing purposes in a synchronous data processing system, suitable clock pulse timing sequences can be delivered to the registers, as well as to the AND and OR planes, in order to ensure this orderly timing of operation. Thus, the registers, as well as the planes, can operate to receive, as well as to deliver, new data signals during appropriate phases of each cycle of the clock. Thus, for example, during a first phase of each such cycle the input register by the AND plane, during a second phase the AND plane generates new corresponding data for propagation to and reception by the OR plane, during a third phase the OR plane generates new corresponding data for propagation to and reception by the output register, and during a fourth phase the output register receives the new data from the OR plane for propagation to other parts of the system as well as for propagation as feedback to the input register.

The duration of each of the pulses which enables the input register to be transparent—i.e., to receive fresh data—is ordinarily equal to the duration of each of the pulses which enable the output register to be transparent, but each pulse is applied to the input register during a different portion (first phase) of the cycle from that (fourth phase) during which each pulse is applied to the output register. Thus, the first and fourth phases are equal in time duration, but are not coincident.

In general, there is at least one output line of the OR plane to which so many crosspoint transistors are connected that the resulting response time delay of such output line is so long (owing to crosspoint transistor capacitance loading) that it is necessary for the fourth phase to succeed (rather than coincide with) the third phase. Thus, in general, the first, second, third, and fourth phases are successive phases. The time durations of all such phases are advantageously mutually equal, moreover, for simplicity of design of the circuitry that supplies the control timing for these phases.

In a variety of data processing contexts it is desirable to perform further logic transformations upon the output data emanating from the OR plane of a PLA before delivering the data to other parts of the system, such as to the ALU (Arithmetic Logic Unit), or before feeding back the data to the AND plane. In U.S. Pat. No. 4,339,516, issued to Blahut et al on Aug. 16, 1983 entitled "Stored-Program Control Machine," a single logic gate—specifically a static (unclocked) AND gate—was inserted in each of the feedback lines of a given PLA to receive data from the PLA output register, as well as data from one or more other PLAs in the data processing system, and to process and deliver data back to the PLA input register. In that manner, some additional data processing capability was added to the PLA. The amount of such additional processing on each line, however, is limited because of the need for the data emanating from the added logic network to be valid as soon as the input register becomes transparent, i.e., at the beginning of each first phase; othewise the data would not arrive soon enough at the crosspoint driver transistors of the AND plane, particularly in view of the propagation delays along the paths from the input register to these crosspoint drivers. And further, because of inherent propagation delays in the feedback lines, the additional processing capability was thus limited to an amount corresponding to a propagation delay of less than the duration of a single clock phase, if the processing is done by the relatively slow static logic. On the other hand, in certain systems it is desirable to add more data processing capability, such as a multistage logic network, having a propagation delay corresponding to more than only a single phase, that is, to insert a multistage logic network having a plurality of successive stages (a plurality of successive logic gates in tandem). Such a multistage logic network, however, has a propagation time delay for new data propagating therethrough which is longer than that of the OR plane, and can be even longer than the duration of a transparent phase of the output register. Such a desired longer propagation delay for the added logic network makes it very difficult to insert the added logic network into the PLA in this manner unless the duration of each of the mutually equal phases is prolonged and hence the speed of operation is undesirably slowed down.

SUMMARY OF THE INVENTION

In a data processing system, a multistage logic network having a propagation delay which is longer than that of the OR plane in a given PLA and can be longer than that of a transparent phase of the output register of the PLA is connected for receiving data from the OR plane as well as from another part of the data processing system (such as one or more other PLAs) and for delivering data to the output register of the PLA. At the same time, no registers at all need be added, and the speed of operation is not slowed down.

Accordingly, this invention involves a semiconductor integrated circuit which includes a PLA having an input register, an AND plane connected for receiving first data from the input register, an OR plane connected for receiving second data from the AND plane, an output register, and a logic network connected for receiving third data from the OR plane and for delivering fourth data to the output register, the propagation delay o the logic network being longer than that of the OR plane. The logic network is advantageously a multistage domino CMOS logic network, i.e., a multistage network of the type described, for example, in a paper entitled "High-Speed Compact Circuits with CMOS," by R. H. Krambeck et al published in IEEE *Journal of Solid State Circuits,* Vol. SC-17, pp. 614–619 (1982). Further, the OR plane is advantageously an array of single-stage domino CMOS logic having control timing the same as that of the multistage domino CMOS network, whereby the precharge and evaluation phases of the OR plane coincide respectively with the precharge and evaluation phases of the domino logic network.

The sum of the propagation time delays of the OR plane and the logic network is advantageously less than twice the time duration of the clock pulse phase which, during each cycle of PLA operation, enables the output register to receive fresh data from the logic network (i.e., the clock pulse that makes the output register transparent). Thus, a smaller propagation delay in the OR plane enables more delay in the logic network and hence enables the logic network to have more stages. On the other hand, the propagation delay of the OR plane is undesirably increased by those output lines thereof which have relatively high capacitance loading, such loading being typically caused by the presence of a relatively large number of crosspoint driver transistors connected to each of such lines, whereby the allowed delay of, and hence the allowed number of stages in, the logic network is limited. Accordingly, if it is desired to increase the allowed number of stages in the logic network, the propagation delay time of the OR plane is reduced to a lower amount by splitting any output line of the OR plane that is unduly slow (i.e., any output line having a propagation delay time which is a significant fraction of the above-mentioned lower amount) into a pair of parallel lines and combining the outputs of the pair by connecting them through a separate suitable logic gate—such as a domino CMOS OR gate—to the multistage logic network. Thus, further in accordance with the invention, a semiconductor integrated circuit contains a PLA comprising an input register connected for delivering data to an AND plane, the AND plane being connected for delivering data to an OR plane, the OR plane being connected for delivering data to a multistage logic network, the multistage network being connected for delivering data to an output register, a pair of output lines of the OR plane being connected through a logic gate to the multistage logic, the logic gate advantageously being an OR gate. In this way the propagation delay time through the OR plane plus the OR gate can be made to be less than the duration of the transparent phase interval of the output register by a first predetermined amount of time, and the propagation delay through the multistage logic network can then be more than the duration of the transparent phase of the output register by a second amount of time, the second amount being less than the first so that the sum of the propagation delays of the OR plane, the OR gate, and the multistage logic network is less than twice the transparent phase interval of the output register, whereby data exiting from the logic network arrive at the output register early enough in time for being received and latched therein. In this manner, the system can be timed so that data from the output register can be available (valid) after a delay equal to only two phase intervals subsequent to the validity of data entering the OR plane, even though the data must traverse both the OR plane and the multistage logic circuit, the latter alone having a propagation delay greater than one transparent phase interval of the output register, while the amount of logic computation capability of the multistage circuit can correspond to more than the duration of, for example, the transparent phase interval of the output register by an extra amount of logic capability corresponding to the second predetermined amount of time.

In a specific embodiment of the invention, a cycle of operation has four equal consecutive clock phases, $\phi_1$, $\phi_2$, $\phi_3$, and $\phi_4$. Each phase typically corresponds to the pulse duration of first, second, third, and fourth clock pulse sequences (FIG. 5). An input register is timed to be transparent during each first phase $\phi_1$. The output data of the register is delivered to the AND plane of a PLA. Each of the AND and OR planes of the PLA has the configuration of a single-stage dynamic NMOS logic. The AND plane is timed so as to precharge during the first phase $\phi_1$ and to deliver its output data which are valid during the second phase $\phi_2$. Each second phase commences substantially immediately following the termination of the corresponding first phase $\phi_1$. The output data from the AND plane are then delivered to the OR plane of the PLA which precharges during the second phase $\phi_2$. The resulting output data from the OR plane are valid commencing with the end of the second clock phase $\phi_2$, and these output data are then delivered from the OR plane to a multistage domino logic network which precharges during each second phase $\phi_2$ (i.e., simultaneously with the precharging of the OR plane). After the data from the OR plane propagate through and are processed by the domino network, output data from the domino network are valid at some time during the fourth phase $\phi_4$. These output data from the domino circuit are then delivered to an output register which is timed to be transparent during each fourth phase $\phi_4$. The output register then delivers its outputs to other parts of the system, as well as back to the input register. In addition, to speed up the operation of the OR plane itself, at least one pair of output lines of the OR plane is advantageously connected to an OR gate whose output terminal is connected to an input terminal of the domino network. Thus, the PLA can handle added domino logic corresponding to a propagation delay of more than one clock phase.

BRIEF DESCRIPTION OF THE DRAWING

This invention together with its features, advantages, and objects can be better understood from the following detailed description when read in conjunction with the drawing in which:

FIGS. 2 and 3 illustrate a circuit schematic diagram of an integrated circuit PLA chain logic scheme in accordance with a specific embodiment of the invention;

FIG. 4 shows the relationship of FIGS. 2 and 3;

Figure 1:
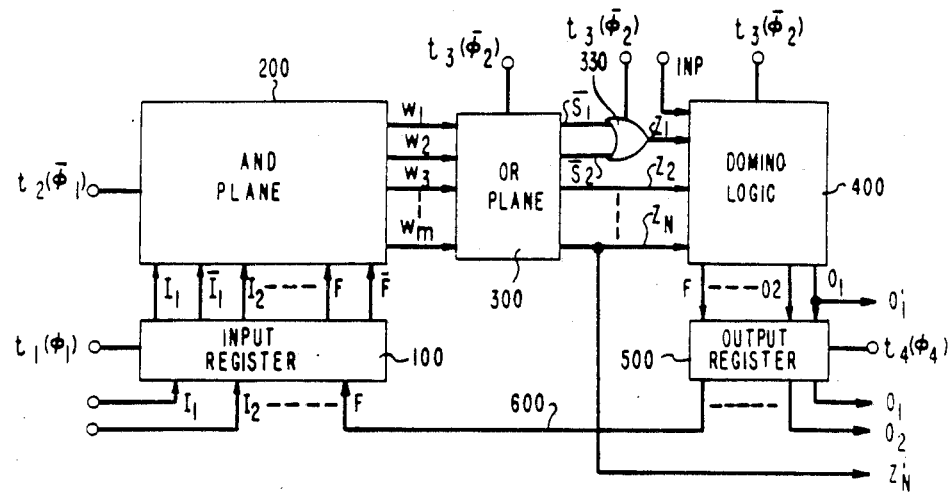
FIG. 1 is a logic diagram of a PLA chain logic scheme in accordance with the invention.

All transistors in the drawings are advantageously enhancement mode MOS, with PMOS (p-channel) transistors denoted by the letter "p"; and NMOS (n-channel) by the letter "n". Typically, the voltage $V_{DD}$ is about +5.0 volt, and $V_{SS}$ is semiconductor substrate ground. The threshold of all PMOS transistors is typically about −0.7 volt (i.e., 0.7 volt below $V_{DD}$); of NMOS transistors, typically about 0.7 volt.

DETAILED DESCRIPTION

FIG. 1 illustrates in data stream sequence: an input register 100, an AND plane 200, an OR plane 300, a domino logic network 400, and an output register 500.

The input register 100 is controlled by timing $t_1(\phi_1)$, the AND plane 200 by timing $t_2(\overline{\phi_1})$, the OR plane 300 by timing $t_3(\phi_2)$, and the output register 500 by timing $t_4(\phi_4)$. For the sake of definiteness, operation during a given cycle $t_1$ through $t_5$ (FIG. 5) will be described in detail, with the understanding that during each of the succeeding cycles, the sequence of operation is similar.

Figure 5:
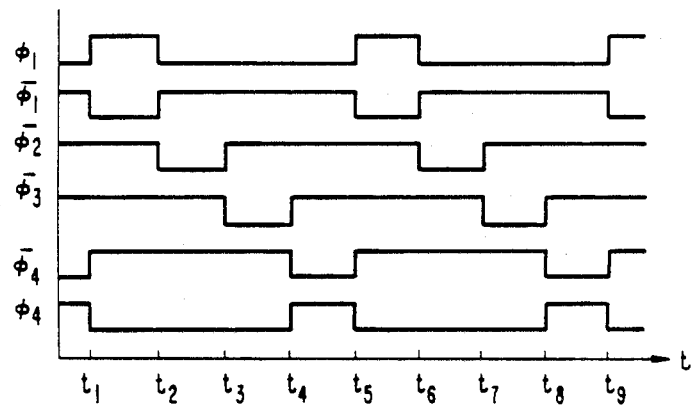
FIG. 5 is a timing diagram of control timing for the schemes shown in FIGS. 1, 2, and 3.

Typically, the time $t_1$ is the time of commencement of a first positive-going phase clock pulse $\phi_1$, as indicated in FIG. 5, whereas $t_2$, $t_3$, and $t_4$ are the respective times of commencement of subsequent second, third, and fourth clock phases $\phi_2$, $\phi_3$, $\phi_4$. In general, the time intervals $t_1t_2$, $t_2t_3$, $t_3t_4$, and $t_4t_5$ are all mutually equal. The input register 100 is transparent during $t_1t_2$ (and $t_5t_6$ during the next cycle) and latches data during $t_2t_5$; the output register 500 is transparent during $t_4t_5$ and latches during $t_1t_4$ (and $t_5t_8$). More specifically, during the time interval $t_1t_2$, fresh data inputs $I_1, I_2, \ldots F$ enter the input register 100, and these inputs together with their complements $\bar{I}_1, \bar{I}_2, \ldots \bar{F}$ are thus delivered to the AND plane 200 as fresh data commencing at time $t_1$ (except for small propagation delays in the input register). In particular, the input F is supplied as feedback from the output register 500, and the inputs $I_1, I_2, \ldots$ are supplied by other parts of the system (not shown).

After passage through and processing by the AND plane 200, fresh data emanate during the given cycle from this AND plane along wordlines $W_1, W_2, W_3 \ldots W_m$ commencing at time $t_2$, and these data are then delivered to the OR plane 300. Typically, $t_2$ is the time of commencement of the positive-going phase clock pulse $\overline{\phi_1}$, the complement of $\phi_1$ (FIG. 5), except for possible safety margins (not shown). After passage through and processing by the OR plane 300, fresh date $Z_1, Z_2, \ldots Z_N$ emanate from this OR plane commencing at time $t_3$ (FIG. 3), and these data are then delivered to the domino logic 400.

Note that the data $Z_1$ is produced by processing a pair of output signals $\bar{S}_1, \bar{S}_2$ emanating directly from the OR plane 300 through a dynamic OR gate 330 whose timing is controlled by $\overline{\phi_2}$ (fresh data can emanate from the OR gate 330 commencing at $t_3$), for reasons described more fully below in connection with FIGS. 2 and 3. Briefly, the use of the dynamic OR gate 330 enables splitting an otherwise slow (heavily capacitively loaded) output line of the OR plane 300 into two faster (less heavily loaded) output lines and thus enables earlier availability of the data $Z_1$ for further processing by the domino logic 400. In terms of the outputs $\bar{S}_1$ and $\bar{S}_2$ emanating from the OR plane: $Z_1 = \bar{S}_1 + \bar{S}_2$, where the "plus" sign denotes a logical sum, i.e., the logic OR function ($Z_1$ is TRUE if and only if either or both of the logic variables $\bar{S}_1, \bar{S}_2$ are TRUE).

In addition to $Z_1, Z_2, \ldots Z_N$, input signals INP originating from one or more other OR planes of the other PLAs (not shown) and/or other domino logic (not shown) that are clock-timed identically as are the OR plane 300 and the domino logic 400, but are located in other parts of the system, can also directly deliver input date to the logic network 400. Conversely, any of the signals $Z_1, Z_2, \ldots Z_N$ can also be directly delivered to such other domino logic located in other parts of the system, as indicated by the arrow labeled $Z'_N$. By the term "directly" it is meant that the data are delivered along paths without any intervening registers.

After passage through and processing by the domino logic network 400, fresh output data $O_1, O_2, \ldots F$ would emanate from the domino logic network 400 commencing at the time $t_3$, except for the unavoidable propagation delays encountered in the domino logic 400, but in general, these data actually emanate from the domino network 400 commencing at some time after $t_4$ but before $t_5$. These data from the domino logic 400 are then delivered directly to the output register 500 and/or directly to other domino logic (not shown) located in other parts of the system, as indicated by the arrow $O_j'$. The output register 500 is transparent and delivers fresh data during the given cycle commencing at time $t_4$, typically the commencement of a positive-going fourth clock phase pulse, $\phi_4$. Also, this output register latches at time $t_5$ (and continues to deliver the same data during $t_5 t_8$ of the next cycle). The sum of the propagation delays of fresh data propagating from the OR plane to the domino logic and then through the domino logic 400 to the output register 500 should therefore be significantly less than the time interval $t_3 t_5$ in order to ensure arrival of the data at the register 500 in time for latching (at $t_5$) therein. Thus, the output register 500 delivers these fresh output data $O_1, O_2, \ldots$ to other parts of the data processing system (such as an arithmetic logic unit) and delivers the output F as feedback to the input register along a feedback data line 600.

Figure 2:
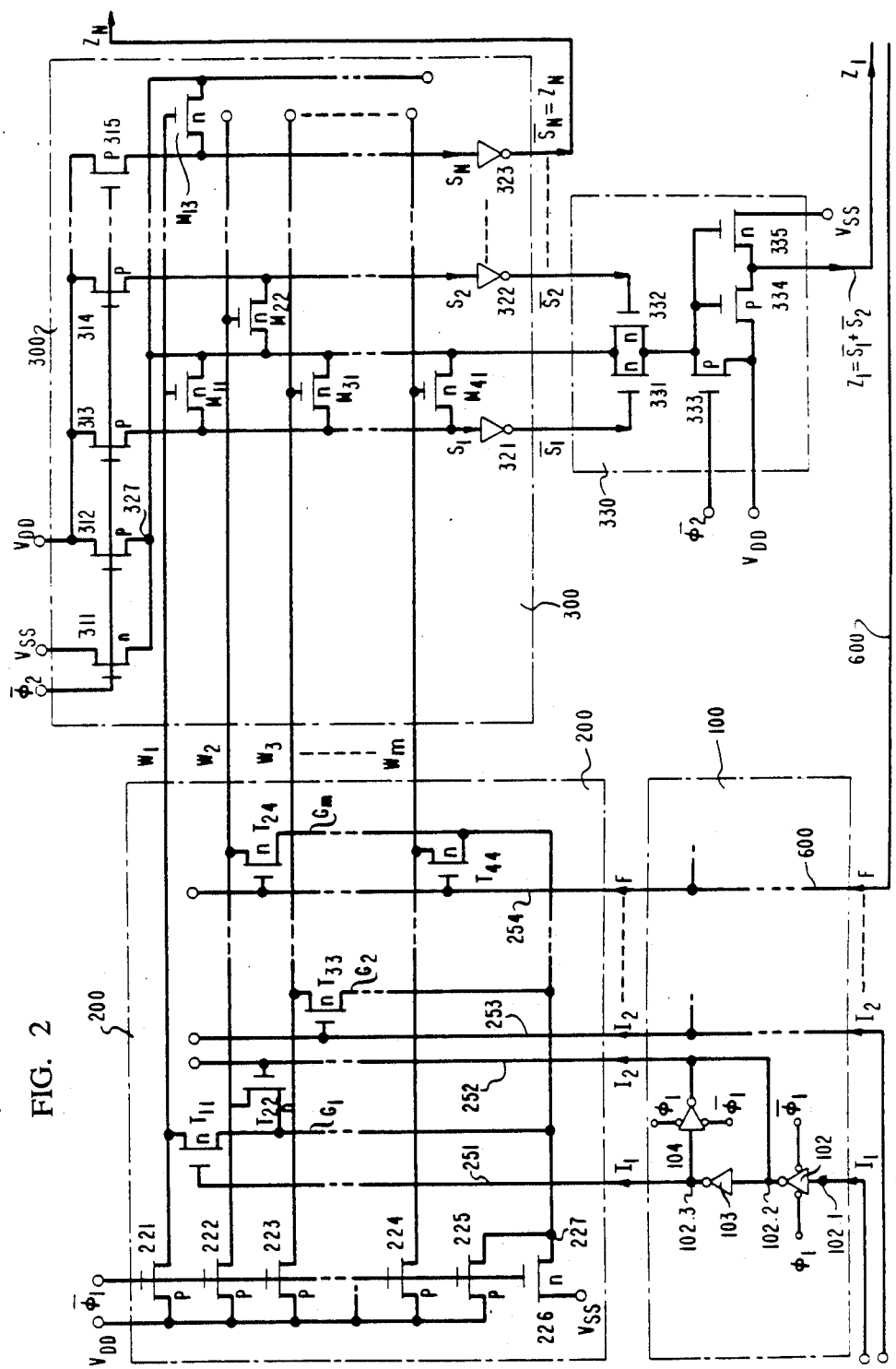

FIGS. 2 and 3, as related to each other in accordance with FIG. 4, show a circuit diagram of a PLA chain logic scheme in accordance with a specific embodiment of the invention. Elements of FIGS. 2 and 3 which are the same as or illustrative of those of FIG. 1 are denoted by the same reference numerals. For the sake of simplicity of labeling, in the description that follows, the same reference label is often used to refer to a signal and to the corresponding signal line on which the signal propagates.

As shown in FIG. 2, the input register 100 receives input data signals $I_1, I_2, \ldots$, as well as feedback data signal F on feedback line 600, and delivers all these inputs together with their complements $\bar{I}_1, \bar{I}_2, \ldots \bar{F}$ to the AND plane 200. The input register 100 basically is a parallel load register, that is, a parallel array of clocked static latches. Each of the input signals $I_1, I_2, \ldots$, as well as the feedback signal F, passes through a separate clocked latch for delivery of the respective signals to the AND plane 200, as shown in FIG. 2 in detail for the signal $I_1$ as an example. Thus, the signal $I_1$ is delivered to input node 102.1 of a clocked inverter 102, and then passes through both the clocked inverter 102 and an unclocked inverter 103. The clocked inverter 102 typically is a clocked CMOS inverter as illustrated in greater detail in FIG. 6 and as described in greater detail below. The complementary input signal $\bar{I}_1$ is thereby developed at an intermediate node 102.2 between the clocked inverter 102 and the (unclocked) inverter 103. A (complementary) clocked CMOS inverter 104 is connected in a feedback loop between the output node 102.3 of the inverter 103 and the intermediate node 102.2 for the purpose of providing suitably timed static latching of the complementary input signal $\bar{I}_1$, that is, latching during the time interval $t_2 t_5$ (FIG. 5), when the first clock pulse phase $\phi_1$ is LOW. The clocked inverter 102 is transparent and passes the complement of $I_1$ during the time interval $t_1 t_2$ when the first clock pulse phase $\phi_1$ is HIGH. Similarly, each of the other input signals $I_2 \ldots F$ passes through a separate similarly constructed clocked static latch in the input register 100.

The AND plane 200 (FIG. 2) is constructed as a two-dimensional crosspoint array of single-stage dynamic pseudo-NMOS gates. Clocked ($\bar{\phi}_1$) pullup PMOS transistors 221, 222, 223, ... 224 are connected for precharging the wordlines $W_1, W_2, W_3, \ldots W_m$, respectively, to the voltage $V_{DD}$. A ($\phi_1$) clocked NMOS transistor 226 is connected to serve as a pulldown transistor, that is, to pull down during each evaluation phase the voltage of each of the wordlines to $V_{SS}$ if and when at least one driver connected to the corresponding wordline is in its ON state at any time during the evaluation phase. The wordlines $W_1, W_2, W_3, \ldots W_m$ all run horizontally in the AND plane 200 and intersect therein, at various crosspoints, a plurality of groundlines $G_1, G_2, \ldots G_m$ which run vertically. At each crosspoint, an NMOS driver transistor ($T_{11}, T_{22}, T_{24}, T_{33}, T_{44}$) is or is not connected depending upon the desired logic transformation to be performed by the PLA. For example, NMOS driver transistor $T_{11}$ is connected at the crosspoint of wordline $W_1$ and groundline $G_1$, and the gate electrode of $T_{11}$ is connected to signal line $I_1$. Thus, for example, transistors 221, $T_{11}$, and 226 operate together as one stage of dynamic pseudo-NMOS; as do transistors 222, $T_{22}$, and 226; 222, $T_{24}$, and 226; 223, $T_{33}$, and 226; and 224, $T_{44}$, and 226. An auxiliary clocked pullup transistor 225 is added, if needed, for precharging intermediate interval node 227 which otherwise would undesirably share charge with one or more of the wordlines during precharge phases.

The OR plane 300 (FIG. 2) is constructed similarly to the AND plane 200 (rotated in the plane of the drawing by 90 degrees). The wordlines $W_1, W_2, W_3, \ldots W_m$ serve as input lines of this OR plane 300. Clocked ($\phi_2$) pullup transistors 313, 314, ... 315 precharge the output signal lines $S_1, S_2, \ldots S_N$ to the voltage $V_{DD}$. An auxiliary PMOS pullup transistor 312 can be added to prevent undesirable charge sharing (similarly as was the auxiliary pullup transistor 225 previously described in the AND plane 200) between the output signal lines $S_1, S_2, \ldots S_N$ and the intermediate node 327. Crosspoint NMOS driver transistors $M_{11}, M_{13}, M_{22}, M_{31}, M_{41}$ are connected at selected crosspoints of the wordlines $W_1, W_2, W_3, \ldots W_m$ and the output signal lines $S_1, S_2, \ldots S_N$ in accordance with the desired logic transformation to be performed by the OR plane 300. A clocked NMOS pulldown transistor 311 pulls down the voltage of each of the output signal lines $S_1, S_2, \ldots S_N$ to $V_{SS}$ during each evaluation phase if and when at least one driver connected to the corresponding output signal line is in its ON state. Each of these output signal lines has an (unclocked) inverter 321, 322, ... 323 to invert these output signals to $\bar{S}_1, \bar{S}_2, \ldots \bar{S}_N$. Thus, the OR plane 300—including the inverters 321, 322, ... 323—is an array of single-stage domino CMOS logic.

The dynamic OR gate 330 (FIG. 2) is formed by a NOR gate feeding an inverter. This NOR gate is advantageously implemented by a single stage of dynamic pseudo-NMOS as shown in FIG. 2. More specifically, this NOR gate is formed by a pair of parallel NMOS drivers 331 and 332, together with a clocked ($\bar{\phi}_2$) pullup transistor 333 (and the pulldown transistor 311 of the OR plane 300), in accordance with a dynamic pseudo-NMOS stage. The inverter is formed by PMOS pullup transistor 334 in series with NMOS pulldown transistor 335. The output signals $Z_1 = \bar{S}_1 + \bar{S}_2$, etc., of this inverter, together with the other output signals $Z_N$—some or all of which may or may not also be derived from the corresponding output signals $S_N$ through OR gate(s) (not shown)—are delivered to domino logic network 400 (FIG. 3). Only for the sake of clarity and resulting simplicity of the drawing, none of the output signals between $S_2$ and $S_N$ is explicity indicated in FIG. 3.

The domino CMOS logic network 400 (FIG. 3) is only illustrative of the many possible domino CMOS arrangements. Accordingly, in the network 400 illustratively only three successive stages are explicitly shown: (1) a first stage with drivers 402 and 403, (2) a second stage with drivers 422, 423, and 424, and (3) a third stage with drivers 442, 443, 444, and 445. The domino logic network 400 has PMOS pullup transistors 401, 421, and 441 and NMOS pulldown transistors 404, 424, and 446—all of which are timed by the second complementary clock phase $\bar{\phi}_2$ in the same way as the pullup and pulldown transistors, respectively, in the OR plane 300 (FIG. 2). A CMOS inverter 413, formed by PMOS transistor 411 and NMOS transistor 412, inverts the output of the first stage developed at its output node 410 to form an input to driver 422 of the second stage. Another CMOS inverter 431 inverts the output of the second stage developed at its output node 430 to form an output signal $O_1$ which can illustratively serve both as an input to driver 442 of the third stage and as an output of the logic network 400, and hence ultimately as the input $O_1$ to the output register 500. Another output $O_2$ is illustratively developed by CMOS inverter 451 connected to output node 450 of the third stage of the domino network 400; and still other outputs (not shown), as well as the output F, are developed by further stages (not shown) thereof. Input signals INP fed to drivers 443 and 444, for example, can, but need not, come from the same PLA: they can also come from other PLAs that are identically clocked. Therefore, the chain logic scheme of this invention can combine many PLA output variables at high speed.

The output signals $O_1$, $O_2$, ... F emanating from the network 400 are delivered to the output register 500 (FIGS. 1 or 3). This output register has an array of parallel latches timed by $\phi_4$. Each latch is arranged for receiving a different one of the output signals $O_1$, $O_2$, ... F, similar to the way in which the input register is arranged for receiving the input signals $I_1$, $I_2$, ... F. The output register is transparent during the time interval $t_4t_5$ (FIG. 5) of the given cycle $t_1t_5$, i.e., during the interval when the clocked inverter 502 is transparent and passes fresh data. This clocked inverter 502 is typically constructed similarly to the clocked inverter 102 in the input register 100, and it is connected for delivering data to an (unclocked) inverter 503. Another clocked inverter 504 is connected across this inverter 503 to form a feedback loop for latching data during the time interval $t_1t_4$ of the given cycle (and during $t_5t_8$ of the next succeeding cycle).

Note that the third clock pulse sequence $\phi_3$ (FIG. 5) is not actually used in the chain logic scheme of FIG. 1 or of FIGS. 2 and 3, but is illustrated solely to indicate the timing relationships of the second and fourth pulse clock sequences $\phi_2$ and $\phi_4$.

Figure 6:
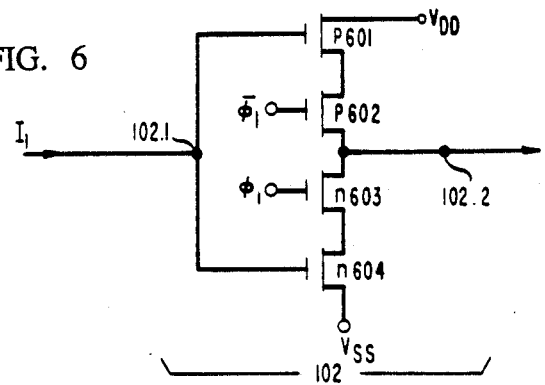
FIG. 6 is a circuit diagram of a typical clocked inverter useful in the scheme shown in FIGS. 2 and 3.

FIG. 6 shows the details of construction of the clocked CMOS inverter 102 (FIG. 2) at the transistor level. All the other clocked CMOS inverters 104, 502, and 504 are similarly constructed. The clocked CMOS inverter 102 (FIG. 6) is basically formed by a pair of series-connected PMOS transistors 601 and 602 connected in series with a pair of series-connected NMOS transistors 603 and 604 between power supply voltage terminals $V_{DD}$ and $V_{SS}$. Input signal line $I_1$ enters the clocked inverter 102 at the input node thereof, 102.1, and the complementary signal $\bar{I}_1$ emanates at the output node 102.2 of this clocked inverter 102. The input signal $I_1$ is applied to the gate terminals of both the PMOS transistor 601 and the NMOS transistor 604, the first clock phase pulse sequence $\phi_1$ is applied to the gate terminal of the NMOS transistor 603, and the first complementary clock phase pulse sequence $\bar{\phi}_1$ is applied to the gate terminal of the PMOS transistor 602. During $t_1t_2$ when $\phi_1$ goes High and hence $\bar{\phi}_1$ goes LOW, both NMOS transistor 603 and PMOS transistor 602 turn ON. Accordingly, if the input $I_1$ is then (during $t_1t_2$) HIGH, NMOS transistor 604 is then ON while PMOS transistor 601 is then OFF, so that the voltage at the output node 102.2 goes to $V_{SS}$, i.e., the output $\bar{I}_1$ is LOW. On the other hand, if during $t_1t_2$ the input $I_1$ is LOW, NMOS transistor 604 is OFF and PMOS transistor 601 is ON, so that the voltage at the output node 102.2 goes to $V_{DD}$, i.e., the output $\bar{I}_1$ is HIGH. Furthermore, during the following time interval $t_2t_5$ when $\phi_1$ is LOW and $\bar{\phi}_1$ is HIGH, then both the NMOS transistor 603 and the PMOS transistor 602 are OFF, so that the output node 102.2 floats, i.e., remains at substantially the same voltage as at the end of the time interval $t_1t_2$. Accordingly, the clocked CMOS inverter 102 is transparent and passes the inverted value of the input $I_1$ during the time interval $t_1t_2$ when $\bar{\phi}_1$ is HIGH, and is in a high impedance state during the remaining portion $t_2t_5$ of the given cycle, just as desired of a clocked inverter. On the other hand, the other clocked CMOS inverter 104 is timed in complementary fashion relative to the timing of the clocked inverter 102, since the timing control terminals to which $\phi_1$ and $\bar{\phi}_1$ are connected in the inverter 102 are respectively the noninverting and inverting timing control terminals (the gate terminals of transistors 603 and 602 in FIG. 6), i.e., in the reverse order from the connections of $\phi_1$ and $\bar{\phi}_1$, respectively, to the corresponding timing control terminals of the clocked inverter 104.

During operation, after the inverted input signal $\bar{I}_1$ emanates from the clocked inverter 102 at node 102.2 of the input register 100, this signal $\bar{I}_1$ then passes through a nonclocked inverter 103 and is thus delivered as noninverted (doubly inverted) signal $I_1$ to line 251 of the AND plane 200. In addition, the inverted signal $\bar{I}_1$ is delivered directly from the output node 102.2 to line 252 of the AND plane. Similarly, $I_2$ ... F are delivered to input lines 253 ... 254 or the OR plane.

The OR plane 200 operates as follows during the given cycle $t_1t_5$. During the interval $t_1t_2$ when $\phi_1$ is HIGH and $\bar{\phi}_2$ is LOW, the PMOS pullup transistors 221, 222, ... 225 are all ON. At the same time, the pulldown transistor 226 is OFF. Hence the intermediate internal node 227 and all the wordlines $W_1$, $W_2$, ... $W_m$ are precharged HIGH, i.e., essentially to $V_{DD}$. Thereafter, during the immediately succeeding time interval $t_2t_5$ when $\phi_1$ is LOW and $\bar{\phi}_1$ is HIGH, the pullup transistors 221, 222, ... 225 are all OFF but the pulldown transistors 226 is ON, whereby each of the wordlines $W_1$, $W_2$, ... $W_m$ does or does not go LOW, i.e., discharge essentially to $V_{SS}$, depending upon whether or not there is any crosspoint driver transistor connected to that wordline which is ON, i.e., which has an input to its gate terminal that is HIGH. Thus, the time interval $t_1t_2$ corresponds to a precharge phase during which every wordline is charged HIGH, and the time interval $t_2t_5$ corresponds to an evaluation phase during which the voltage on every wordline is valid, i.e., depends upon the input signals in accordance with the prescribed logic transformation of the AND plane.

The OR plane 300 operates similarly as the AND plane except that the precharge phase is $t_2t_3$, i.e., the phase during which the second clock sequence $\phi_2$ is HIGH. Thus, the output signals $S_1, S_2, \ldots S_N$ of the OR plane are valid during $t_3t_6$, rather than $t_2t_5$ as in the case of the AND plane. These output signals $S_1, S_2, \ldots S_N$ respectively pass through inverters 321, 322, ... 323 and become complementary outputs $\bar{S}_1, \bar{S}_2, \ldots \bar{S}_N$. As discussed above, the output signals $\bar{S}_1$ and $\bar{S}_2$ pass through the OR gate 330 to become the signal $Z_1$ for input to the domino logic network 400. On the other hand, assuming that the output line $S_N$ is not heavily loaded and hence need not be split into two (or more) lines, then $\bar{S}_N$ itself is directly utilized as the input $Z_N$ to the domino logic network 400.

The domino logic network 400 (FIG. 3) operates as follows. During the time interval $t_2t_3$ when $\bar{\phi}_2$ is HIGH and $\phi_2$ is LOW, the PMOS pullup transistors 401, 421, and 441 are all ON; so that all the output nodes 410, 430, ... which are located on the input side of the inverters 413, 431, ... are HIGH; and all the output nodes 414, 432, ... which are located on the output side of these inverters are LOW. Accordingly, all outputs $O_1, O_2, \ldots F$ of the domino logic 400 are LOW during $t_2t_3$. On the other hand, beginning at time $t_3$, the outputs $S_1, S_2, \ldots S_N$ of the OR plane 300 become valid and propagate through the domino logic network to the output register 500.

The output register 500 is a parallel load register similar to the input register 100. For example, the signal F from the domino logic network 400 is delivered to a clocked inverter 502 whose timing is controlled by the fourth clock pulse phase $\phi_4$. This clocked inverter is thus transparent and passes fresh data during $t_4t_5$ of the given cycle. Latching of the data in the feedback loop is supplied by the clocked inverter 504 and occurs throughout $t_1t_4$ of the given cycle ($t_1t_5$) and $t_5t_8$ of the next succeeding cycle ($t_5t_9$). Thus, in particular, during the given cycle the (latched) outputs $O_1, O_2, \ldots F$ emanating from the output register 500 during the time intervals $t_1t_4$ and $t_5t_8$ are determined by the data arriving at this output register from the logic network 400 at times $t_1$ and $t_5$, respectively. In particular, the outputs $O_1, O_2, \ldots F$ emanating from the output register which are valid during the next succeeding cycle are those arriving at the output register 500 essentially at $t_5$ (that is, at $t_5$ except for a small response delay time of the register). Accordingly, the output register 500 is timed to latch fresh data from the logic network 400 corresponding to fresh data delivered to the OR plane 300 from the AND plane as late as at $t_3$. Since the time duration of all phases are equal ($t_1t_2 = t_2t_3 = t_3t_4 = t_4t_5$), the output register can properly handle data during a given cycle which have suffered a total propagation delay, in the OR plane 300 plus the domino logic network 400, equal to as much as essentially $t_3t_4 + t_4t_5 = 2t_4t_5$, or twice the time interval of the transparent phase ($t_4t_5$) of the output register.

It should be understood that although the invention has been described in terms of specific embodiments, various modifications can be made without departing from the scope of the invention. For example, the OR gate 330 can be a multiple input OR gate with more than two input terminals, so that the outputs on more than two output lines of the OR plane can be connected to and combined by the multiple input OR gate for delivery to the logic network 400 in case the operating speed is not sufficiently reduced by splitting an original output line into just two lines. Moreover, each of more than one pair of output lines can be connected to a pair of input terminals of a separate OR gate in case it is desirable to split more than one of the original output lines in order to increase the operating speed of these additional lines.

What is claimed is:

1. A semiconductor integrated circuit comprising a PLA operable on a periodic cycle, the PLA having an input register connected to a source of first data, an AND plane connected to the input register for receiving the first data from the input register, an OR plane connected to the AND plane for receiving second data from the AND plane, and output register, a multistage logic network connected to the OR plane and to another part of the circuit for receiving third data both from the OR plane and from the other part of the circuit, for producing fourth data and for delivering the fourth data to the output register, means for feeding back at least some of fourth data from the output register to the input register in time for being received by the AND plane during the next succeeding cycle, the OR plane and the logic network being connected to a single control timing means which simultaneously precharges the OR plane and the logic network during a predetermined portion of each said cycle.

2. The circuit of claim 1 in which said another part of the circuit is another PLA and in which the logic network has a propagation delay which is longer than that of the OR plane.

3. The circuit of claim 1 in which the logic network is a multistage domino logic network, the OR plane and the logic network connected to first control timing for precharging the OR plane and the logic network simultaneously during a precharge phase of each cycle of operation, and in which the output register is connected to second control timing for making the output register transparent to reception of the fourth data during a transparent phase subsequent to the precharge phase during each such cycle.

4. The circuit of claim 3 in which the sum of the propagation delays of the domino logic network and the OR plane is greater than the duration of each transparent phase of the output register.

5. In a semiconductor integrated circuit:
a PLA including an OR plane, a multistage domino logic network, connected to the OR plane so as to receive first data from the OR plane, for producing second data in response to the first data, and an output register which is connected to the network so as to receive the second data therefrom, the OR plane comprising an array of single-stage domino CMOS logic, the OR plane and the logic network being connected to control timing which simultaneously precharges the OR plane and the network.

6. A semiconductor integrated circuit operable on first, second, third, and fourth control timing with associated successive first, second, third, and fourth phases, respectively, comprising:
(a) an input register, connected to a source of first data and to the control timing, for receiving during each first phase the first data;
(b) and AND plane, connected to the input register and to the second control timing for receiving during each second phase the first data from the input register and for processing the first data to produce second data;

(c) an OR plane connected to the AND plane and to the third control timing for receiving during each third phase the second data and for processing the second data to produce third data;

(d) a multistage domino logic network, connected to the OR plane, to another part of the circuit, and to the third control timing, for receiving the third data from the OR plane and other data from the other part of the circuit and for processing the third and the other data to produce fourth data; and (e) an output register, connected to the domino logic network and to the fourth control timing for receiving the fourth data from the domino logic network during a fourth phase and for delivering at least some of the fourth data to the input register.

7. The circuit of claim 6 in which the propagation delay of the OR plane is less than that of the domino logic network.

8. The circuit of claim 6 in which the first, second, third, and fourth phase intervals are mutually equal in length.

9. The circuit of claim 6 in which the OR plane contains at least one pair of output lines connected to an OR gate whose output terminal is connected to an input terminal of the domino logic network.

* * * * *